(12) United States Patent
Blank (10) Patent No.: US 10,155,309 B1
(45) Date of Patent: Dec. 18, 2018

(54) WAFER HANDLING ROBOTS WITH ROTATIONAL JOINT ENCODERS

(71) Applicant: Lam Research Corporation, Fremont, CA (US)

(72) Inventor: Richard M. Blank, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/815,325

(22) Filed: Nov. 16, 2017

(51) Int. Cl.
| | |
|---|---|
| *B25J 9/04* | (2006.01) |
| *B25J 9/08* | (2006.01) |
| *B25J 9/10* | (2006.01) |
| *H01L 21/687* | (2006.01) |
| *H01L 21/67* | (2006.01) |
| *H01L 21/677* | (2006.01) |
| *B25J 11/00* | (2006.01) |
| *H01L 21/68* | (2006.01) |
| *B25J 13/08* | (2006.01) |

(52) U.S. Cl.
CPC ............ *B25J 9/1005* (2013.01); *B25J 9/042* (2013.01); *B25J 9/043* (2013.01); *B25J 11/0095* (2013.01); *B25J 13/088* (2013.01); *H01L 21/67201* (2013.01); *H01L 21/67259* (2013.01); *H01L 21/67742* (2013.01); *H01L 21/67766* (2013.01); *H01L 21/67778* (2013.01); *H01L 21/68* (2013.01); *H01L 21/68707* (2013.01); *G05B 2219/45031* (2013.01)

(58) Field of Classification Search
CPC ........... B25J 9/042; B25J 9/043; B25J 13/088
See application file for complete search history.

(56) References Cited

U.S. PATENT DOCUMENTS

| | | | |
|---|---|---|---|
| 3,890,552 A | 6/1975 | Devol et al. | |
| 4,880,348 A | 11/1989 | Baker et al. | |
| 5,135,349 A | 8/1992 | Lorenz et al. | |
| 5,666,202 A | 9/1997 | Kyrazis | |
| 5,746,565 A | 5/1998 | Tepolt | |
| 5,789,890 A | 8/1998 | Genov et al. | |
| 5,980,194 A | 11/1999 | Freerks et al. | |
| 6,121,743 A | 9/2000 | Genov et al. | |
| 6,275,748 B1 | 8/2001 | Bacchi et al. | |
| 6,453,214 B1 | 9/2002 | Bacchi et al. | |
| 6,893,204 B1 * | 5/2005 | Suzuki | B65G 49/067 414/744.5 |
| 7,086,822 B2 * | 8/2006 | Maeda | B25J 9/042 414/744.5 |
| 7,140,655 B2 | 11/2006 | Kesil et al. | |
| 7,792,350 B2 | 9/2010 | Kiley et al. | |
| 8,136,422 B2 * | 3/2012 | Kitahara | B25J 9/042 318/568.21 |

(Continued)

FOREIGN PATENT DOCUMENTS

| | | | |
|---|---|---|---|
| JP | 11000888 A | * | 1/1999 |
| JP | 11347982 A | * | 12/1999 |
| JP | 2003170384 A | * | 6/2003 |

*Primary Examiner* — Gerald McClain
(74) *Attorney, Agent, or Firm* — Weaver Austin Villeneuve & Sampson LLP (57) ABSTRACT

Wafer handling robots are provided that are configured to provide high wafer placement accuracy. Such robots utilize rotational drive transfer mechanisms as well as rotational encoders that are located at each rotational joint, as opposed to solely at the motor outputs.

18 Claims, 6 Drawing Sheets

(56) References Cited

U.S. PATENT DOCUMENTS

| | | | | |
|---|---|---|---|---|
| 8,668,428 | B2* | 3/2014 | Hino | B25J 9/042 |
| | | | | 414/744.5 |
| 9,076,830 | B2* | 7/2015 | Kremerman | H01L 21/67742 |
| 9,159,601 | B2* | 10/2015 | Matsuzaki | H01L 21/67766 |
| 2002/0130560 | A1* | 9/2002 | Botos | G05D 3/12 |
| | | | | 310/12.06 |
| 2005/0079042 | A1* | 4/2005 | Maeda | B25J 9/042 |
| | | | | 414/744.2 |
| 2007/0269297 | A1 | 11/2007 | Meulen et al. | |
| 2016/0184986 | A1* | 6/2016 | Procyshyn | B25J 9/0009 |
| | | | | 74/490.05 |

* cited by examiner

WAFER HANDLING ROBOTS WITH ROTATIONAL JOINT ENCODERS

BACKGROUND

Semiconductor wafer handling robots are very specialized types of robot that typically include one or two robot arms that terminate in an end effector that may be used to lift a semiconductor wafer. Such robots are used to transport semiconductor wafers in between locations in a semiconductor processing tool, and may operate in either vacuum or atmospheric environments. Such arms typically primarily move in the horizontal plane, although they may also be equipped with a Z-axis linear drive to allow for the entire arm assembly to be moved vertically; they typically do not include the ability to rotate about axes other than vertical axes (no pitch/roll, only yaw).

SUMMARY

Details of one or more implementations of the subject matter described in this specification are set forth in the accompanying drawings and the description below. Other features, aspects, and advantages will become apparent from the description, the drawings, and the claims.

In some implementations, a wafer handling system is provided that includes a robot arm. The robot arm may include a base, a first movable link in which a first end of the first movable link is rotatably connected to the base via a first rotational joint, a second movable link in which a first end of the second movable link is rotatably connected to a second end of the first movable link via a second rotational joint, and a first rotational drive transfer mechanism that includes a first pulley, a second pulley, and one or more first belts spanning between the first pulley and the second pulley. In such an implementation, the second pulley may be fixedly connected with the second movable link, and the first rotational drive transfer mechanism may be configured such that rotation of the first pulley relative to the first movable link causes the second pulley and the second movable link to rotate relative to the first movable link about a center axis of the second rotational joint. Such an implementation may also include a first motor that is located in the base, has a rotational output connected to the first movable link, and is configured to drive the first movable link. Such an implementation may also have a second motor that is located in the base, has a rotational output connected to the first pulley, and is configured to drive the first pulley. Such an implementation may also include a first rotational encoder with a first portion fixedly connected with the base and a second portion fixedly connected with the first movable link, as well as a second rotational encoder with a first portion fixedly connected with the first movable link and a second portion fixedly connected with the second movable link.

In some additional implementations, the first rotational encoder and the second rotational encoder may each have a resolution selected from the group consisting of: 30 bits or more and 33 micro-degrees or more.

In some additional implementations, the first rotational joint may include a first ferrofluidic seal between the base and a portion of the first movable link that extends into the base, and the second rotational joint may include a second ferrofluidic seal between the first movable link and a portion of the second movable link that extends into the first movable link.

In some additional implementations, the robot arm may further include a third movable link in which a first end of the third movable link is rotatably connected to a second end of the second movable link via a third rotational joint, a second rotational drive transfer mechanism that includes a third pulley, a fourth pulley, and one or more second belts spanning between the third pulley and the fourth pulley, and a third rotational encoder with a first portion fixedly connected with the second movable link and a second portion fixedly connected with the third movable link. In such an implementation, the third pulley may be fixedly connected with the first movable link, the fourth pulley may be fixedly connected with the third movable link, and the second rotational drive transfer mechanism may be configured such that rotation of the third pulley relative to the second movable link causes the fourth pulley and the third movable link to rotate relative to the second movable link about a center axis of the third rotational joint.

In some implementations, the robot arm may further include a third motor, a third movable link in which a first end of the third movable link is rotatably connected to a second end of the second movable link via a third rotational joint, a second rotational drive transfer mechanism including a third pulley, a fourth pulley, and one or more second belts spanning between the third pulley and the fourth pulley, and a third rotational encoder with a first portion fixedly connected with the second movable link and a second portion fixedly connected with the third movable link. In such an implementation, the third motor may be configured to cause the third pulley to rotate about a rotational axis of the second rotational joint, the fourth pulley may be fixedly connected with the third movable link, and the second rotational drive transfer mechanism may be configured such that rotation of the third pulley about the center axis of the second rotational joint relative to second movable link causes the fourth pulley and the third movable link to rotate relative to the second movable link about a center axis of the third rotational joint.

In some implementations, the first rotational joint may include a first ferrofluidic seal between the base and a portion of the first movable link that extends into the base, the second rotational joint may include a second ferrofluidic seal between the first movable link and a portion of the second movable link that extends into the first movable link, and the third rotational joint may include a third ferrofluidic seal between the second movable link and a portion of the third movable link that extends into the second movable link.

In some implementations, the first movable link may include a third rotational drive transfer mechanism that includes a fifth pulley, a sixth pulley, and one or more third belts spanning between the fifth pulley and the sixth pulley.

In some implementations, the third motor may be located within the first movable link.

In some implementations, the robot arm may further include a fourth motor, a fourth movable link in which a first end of the fourth movable link is rotatably connected to a second end of the second movable link via the third rotational joint, a fourth rotational drive transfer mechanism including a seventh pulley, an eighth pulley, and one or more fourth belts spanning between the seventh pulley and the eighth pulley, and a fourth rotational encoder with a first portion fixedly connected with the second movable link and a second portion fixedly connected with the fourth movable link. In such an implementation, the fourth motor may be configured to cause the seventh pulley to rotate about a rotational axis of the second rotational joint, the eighth pulley may be fixedly connected with the fourth movable link, and the fourth rotational drive transfer mechanism may be configured such that rotation of the seventh pulley about the center axis of the second rotational joint relative to the second movable link causes the eighth pulley and the fourth movable link to rotate relative to the second movable link about a center axis of the third rotational joint.

In some implementations, the first movable link may further include a fifth rotational drive transfer mechanism that includes a ninth pulley, a tenth pulley, and one or more fifth belts spanning between the ninth pulley and the tenth pulley.

In some implementations, the fourth motor may be located within the first movable link.

In some implementations, the one or more first belts may be made of stainless steel and may include at least two first belts, and each belt of the at least two first belts may have a first end fixedly attached to one of the first pulley of the first rotational drive transfer mechanism and the second pulley of the first rotational drive transfer mechanism and a second end fixedly attached to the other of the first pulley of the first rotational drive transfer mechanism and the second pulley of the first rotational drive transfer mechanism.

In some implementations, the interior spaces of the base, the first movable link, and the second movable link may be in fluidic communication with one another and the first rotational joint and the second rotational joint may both be equipped with vacuum-rated seals.

In some implementations, each of the one or more first belts may be a continuous belt.

In some implementations, each of the one or more first belts may be a v-belt, a flat belt, a toothed belt, or a round belt, and each of the one or more first belts may be made from a material such as rubber or rubber in combination with a woven material.

In some implementations, the wafer handling system may further include a chamber having a nominal width, length, and height. The chamber may have a plurality of wafer stations arranged along opposing walls, each wafer station having a wafer center point. In such implementations, the width may define the nominal distance between the opposing walls and the base may be located with a center axis of the first rotational joint located within 10% to 30% of the width from one of the opposing walls.

In some implementations, the wafer handling system may further include an end effector configured to support a semiconductor wafer and connected to the robot arm such that the end effector is supported by the first movable link and the second movable link. In such implementations, the wafer handling system may also include a controller having a memory and one or more processors that are communicatively connected. The memory may store computer-executable instructions for controlling the one or more processors to receive rotational position data from the first rotational encoder, receive rotational position data from the second rotational encoder, and determine a horizontal location of a point fixed in space relative to the end effector based, at least in part, on the rotational position data from the first and second rotational encoders.

In some implementations, the memory may further store computer-executable instructions for further controlling the one or more processors to control the first motor, the second motor, or the first motor and the second motor to activate for one or more periods of time to cause the point fixed in space relative to the end effector to move from a first location to a second location.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

Semiconductor wafer handling robots are expected to move quickly, precisely, and with little noise, vibration, or potential for particulate generation. Accordingly, such robots are typically designed such that the drive elements (motors) of the robot arm or arms are located in a base (thereby reducing weight in the moving components and increasing the speed with which the robots may operate), and the motive force provided by those motors is then transferred through the arm links to the driven links using some form of mechanical drive, e.g., steel belts.

Such steel belt drive mechanisms are preferred in semiconductor processing equipment for a variety of reasons. As a first matter, stainless steel belts may be much less susceptible to chemical attack than timing belts (which are usually made of combination of polymeric and textile materials; such materials are much more likely to be damaged by chemicals that may be encountered in semiconductor processing facility environments). Stainless steel belts are much less likely to produce particulates during operation, whereas timing belts may produce both particulates (due to their lower strength) and outgassing (due to the polymeric materials used)—both of these side effects are potentially problematic in a semiconductor processing environment since they can affect wafer processing and cleanliness. In a vacuum environment, timing belts also tend to become thermally stressed since they lose the ability to shed heat through convection (due to the lack of atmosphere). When timing belts get hot, they generally become more susceptible to thermal breakdown and may exhibit higher failure rate and particulate generation.

Figure 1:
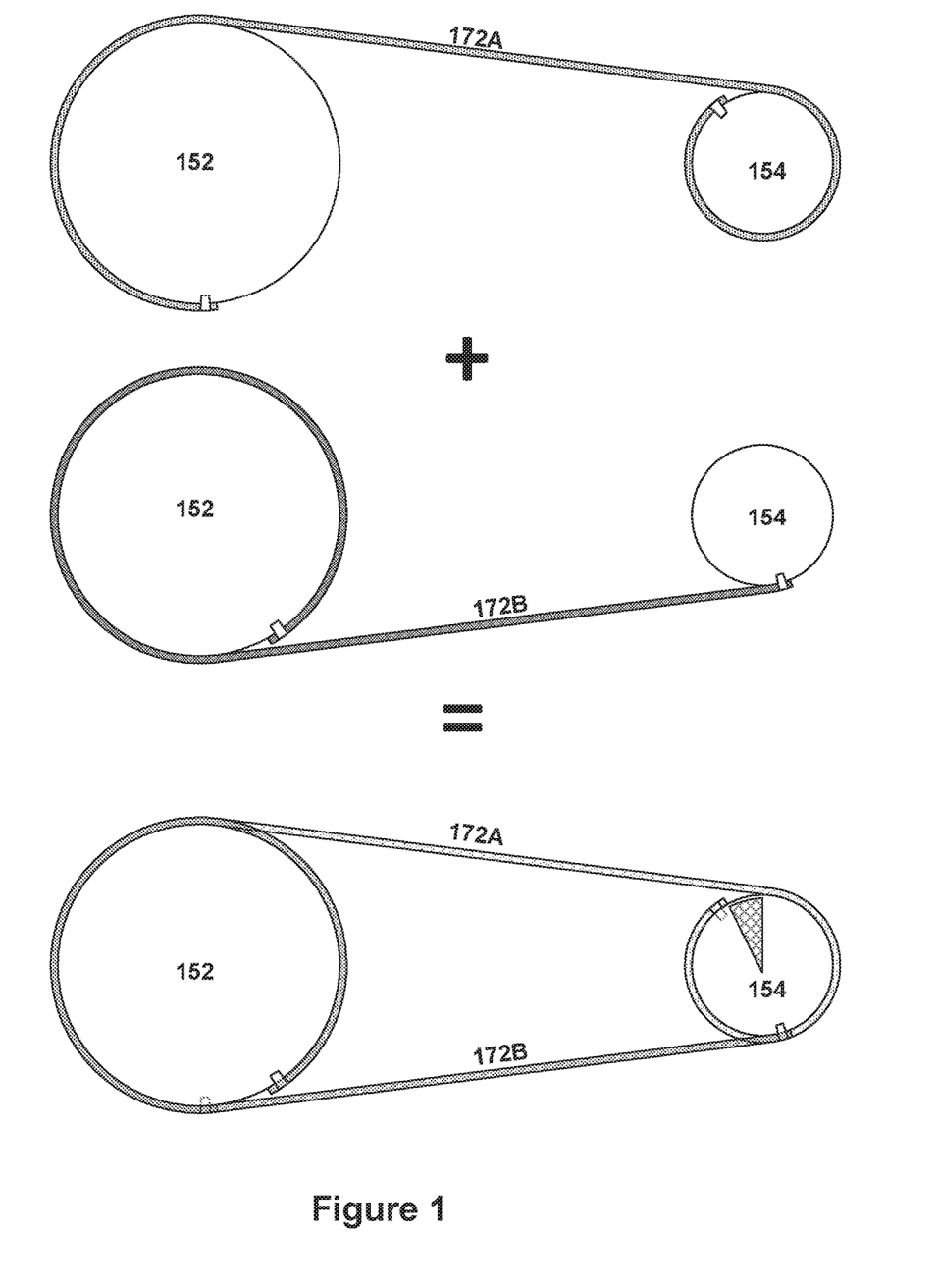
FIG. 1 depicts an example steel belt drive system.

Steel belt drive mechanisms typically feature two non-continuous steel belts that are attached to two sets of pulleys that operate in parallel, e.g., each set is connected to a common shaft. Each belt will be rigidly connected to one of the pulleys in the set, with each belt located on an opposite side of the pulleys from the other belt. This is illustrated, in concept, in FIG. 1. In FIG. 1, a two-pulley drive mechanism is shown in which a first pulley 152 and a second pulley 154 are linked by two first belts 172 (172A and 172B). The upper figure in FIG. 1 shows the first pulley 152, the second pulley 154, and the first belt 172A in isolation; as can be seen, the first belt 172A is not continuous—it is pinned to the first pulley 152 and the second pulley 154 by, in this example, a pin. In actual practice, such attachments may be more complex and may provide, for example, the ability to adjust the tension of the first belt 172A between the two pulleys.

As will be readily apparent, rotating the first pulley 152 counter-clockwise by approximately 160 degrees will cause the second pulley 154 to rotate counterclockwise as well. In this case, since the first pulley 152 is approximately twice as large as the second pulley 154, the second pulley 154 will rotate twice as fast as the first pulley 152—such belt systems may also be used in differently proportioned pulley systems, e.g., 1:1 ratio pulleys.

Rotating the first pulley 152 clockwise, however, does not result in corresponding clockwise movement in the second pulley 154 since the first belt 172A is not placed into tension in this mode of rotation. To allow for such clockwise movement, a first belt 172B (see middle part of FIG. 1) may be affixed to the first pulley 152 and the second pulley 154 in much the same manner as the first belt 172A, but with the first belt 172B generally connected to the pulleys in different locations as compared with the second belt 172B. The resulting rotational drive transfer mechanism may provide for precise rotational positioning that is quite and lightweight. However, a key limitation of such a system is that the amount of rotational movement that such steel-belt systems may provide is less than 360° since the belts typically cannot be allowed to overlap the connection points between the belts and the pulleys. Thus, there is typically at least a 10° to 20° dead zone (shown with the cross-hatched pie segment in the lowermost portion of FIG. 1, which shows both belts on the pulleys simultaneously) through which the pulleys cannot rotate. This limits the range of rotational motion for robots that use such steel belt rotational drive transfer mechanisms, although in most typical implementations, this is not an issue since the available space within the environment where the robot arms operate is typically large enough to avoid having to undergo rotation that would conflict with such a limited range of motion.

Figure 2:
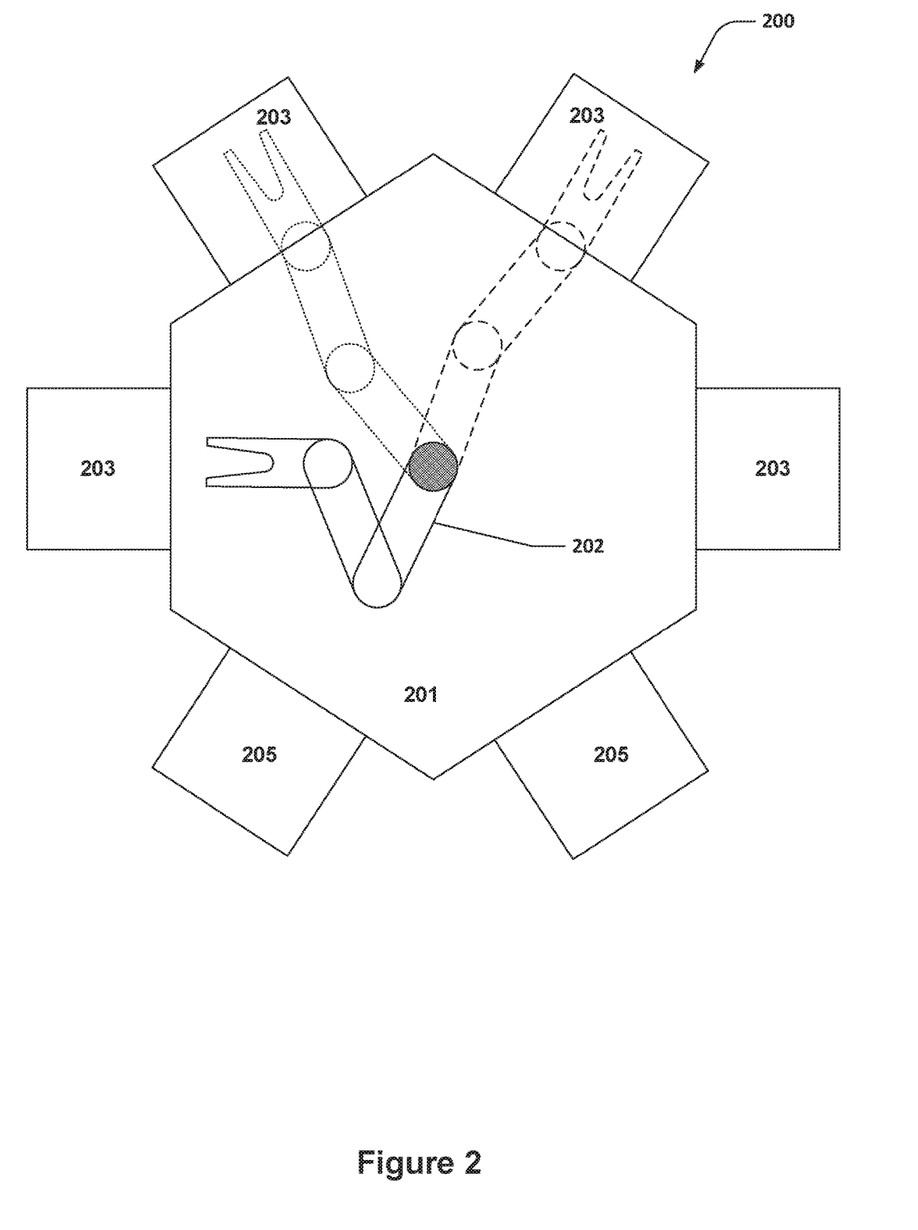
FIG. 2 depicts an example radially arranged transfer system.

For example, in a vacuum environment, it is common to locate the base of a wafer handling robot near at the center of the vacuum environment so that semiconductor processing chambers, load locks, and other stations/locations where wafers may be placed or retrieved from are equidistant from the robot arm base—this can reduce the length of the robot arm, allows for an easier control setup (as robot arm movements may be substantially identical for interacting with each station), and allows the robot to operate without undergoing large joint rotations. FIG. 2 depicts an example of a radially-arranged transfer chamber, which is a chamber that is typically kept at vacuum and that has a plurality of wafer processing chambers connected with it at various positions around it circumference or perimeter. In this example, the transfer chamber 201 (which may also be thought of as a wafer handling system 200) has four wafer processing chambers 203 arranged along four different sides, and two load lock chambers 205, which act as airlocks to allow wafers to enter and exit the vacuum environment of the transfer chamber without disturbing it, arranged along two other sides. As can be seen, the robot arm is able to easily access any of the processing chambers or load locks from its centrally-mounted location.

Figure 3:
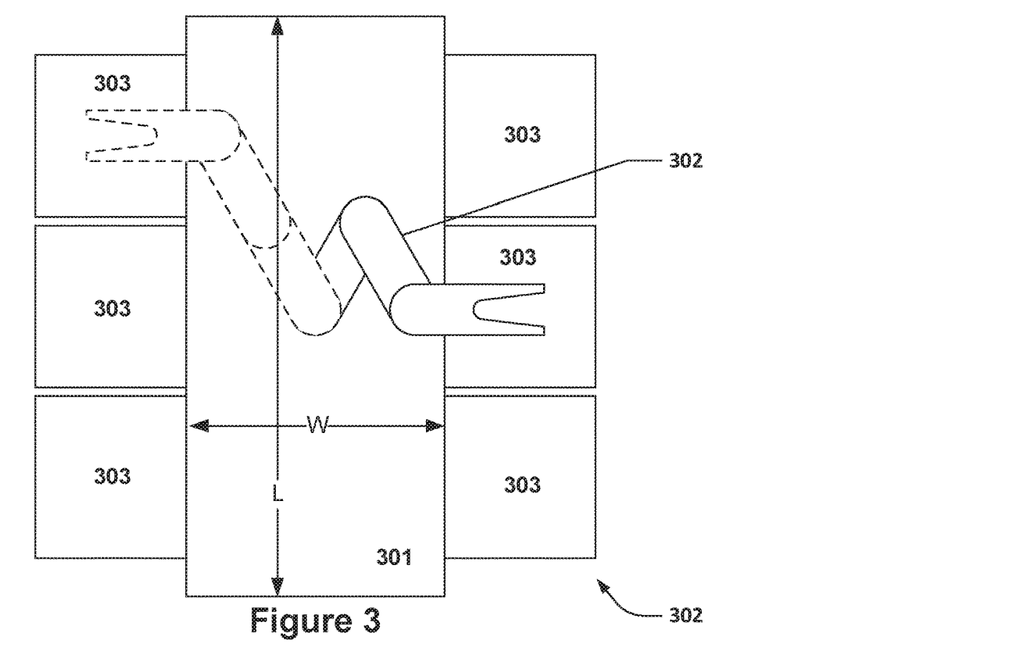
FIG. 3 depicts an example rectangular transfer system with a centered robot arm.

Even in non-radially arranged transfer chambers, it is typical to mount the base of a wafer handling robot generally at the center of such chambers. For example, FIG. 3 depicts an example rectangular-format transfer chamber in which two sets of three processing chambers 303 are arranged along opposing sides of the transfer chamber 301. A centrally-located robot arm 302 is able to reach all of the processing stations 303 without the rotations of any of the rotational joints of the robot arm 302 exceeding 180°.

The present inventor sought to create a new type of transfer chamber in which a robot arm, e.g., similar to the belt-driven robot arms discussed earlier, or variants thereof that are discussed in more detail below, was mounted in an off-center location. Since the drive motors and other electronics (including any vertical lift capability) of such robot arms are typically located in the robot arm base, the bases of such robot arms can be quite large, e.g., a foot in diameter and two or more feet long. For vacuum transfer chambers, the robot arm base is typically mounted in the transfer chamber such that the base protrudes out of the bottom of the chamber so that the chamber volume does not need to include head room for the base. This reduces the volume of the transfer chamber, which makes it less expensive to manufacture, easier to seal, and reduces the amount of time required to pump the transfer chamber down to a vacuum. However, when the base of the robot arm extends through the floor of the transfer chamber, it may intrude into, for example, a walkway or other personnel access passage under the transfer chamber. Such walkways or passages may allow for personnel to service or access components of the processing stations that may be located beneath the processing chambers themselves. The present inventor realized that such arrangements make it difficult for personnel to perform such maintenance or otherwise access such components, and determined that moving the robot arm so that the base of the robot arm is positioned close to one side or the other of the transfer chamber results in a less cramped arrangement underneath the transfer chamber. Instead of having the robot arm base bisect whatever walkway or passage runs beneath the transfer chamber, the base is instead offset to one side, leaving a single open path past it that is twice as wide as the paths past it would be if it were centrally located.

Figure 4:
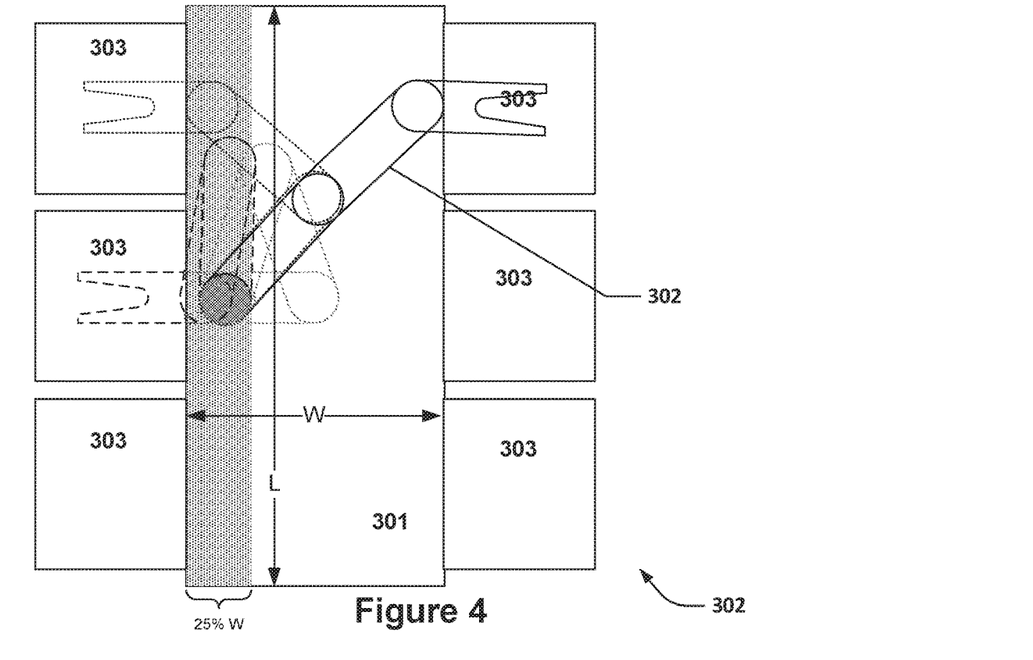
FIG. 4 depicts an example rectangular transfer system with an offset robot arm.

FIG. 4 depicts an example of such a new type of transfer chamber. In FIG. 4, the transfer chamber 301 is similar to the transfer chamber 301 of FIG. 3, except that the base of the robot arm 302 has been shifted to one side, placing it adjacent to one side of the transfer chamber 300. In practice, it may be desirable to place the base of the robot arm 302 as close as possible to one side or the other, although allowances may be made for tolerances, safety clearances, moving component clearances, and so forth. More generally, the base may be centered on a location that is within 25% of the width of the transfer chamber from one of the walls defining the width. For example, if the width of the transfer chamber (left-right dimension in FIG. 4) is 40 inches, then the base of the robot arm 302 may be centered on a location within 10 inches of one of the left or right sides (per the perspective of FIG. 4) of the transfer chamber 301, e.g., at approximately 7 inches from such a side. For a typical robot arm base having a diameter of approximately 12 inches in such an example implementation, this leaves a gap of approximately 28 inches between the base and the opposite side of the transfer chamber 301. Thus, even if equipment underneath the processing chambers 303 extends all the way up to the sides of the transfer chamber, there would still be a passageway under the transfer chamber of at least two feet in width between the robot arm base and such equipment—thereby allowing easier personnel access.

Figure 5:
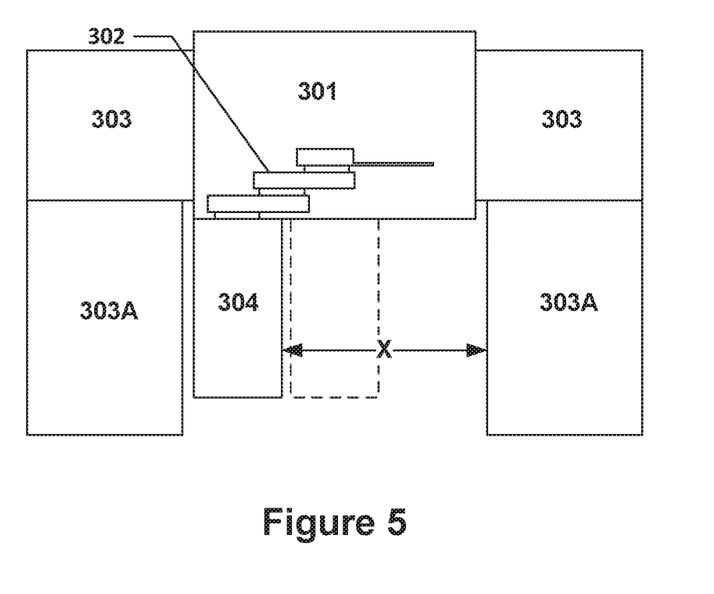
FIG. 5 depicts a front view of the transfer system of FIG. 4.

FIG. 5 depicts a front view of the transfer chamber 301 of FIGS. 3 and 4. In FIG. 5, the transfer chamber 301 is elevated off of the floor. Each processing chamber 303 has chamber support equipment 303A below it, e.g., vertical lift devices for moving a wafer pedestal up and down within the processing chamber 303, cooling systems, power supplies, etc., that may extend down to the floor (or at least partway to the floor). As can be seen, the base 304 is positioned to one side of the transfer chamber 301, leaving a gap "X" for personnel access past the base 304. The dashed outline to the right of the base 304 depicts the base in a centered location, as would typically be done with existing transfer chambers. As can be seen, the centered location drastically reduces the access beneath the transfer chamber 301.

The present inventor also realized, however, that if traditional steel belt-driven wafer handling robot arms were used in such an off-center location, the robot arm might need to undergo larger than normal rotations for some of its links in order to access some process chambers; these rotations would result in the robot arm exceeding the maximum allowable rotation that such steel belt systems permit.

By designing a new type of wafer handling robot arm that utilizes technologies and approaches typically not seen in wafer handling robots, the present inventor was able to overcome this issue. Generally speaking, such wafer handling robot arms replace the steel belt systems that are normally used with a continuous belt system, e.g., using polymeric or polymeric and textile-based timing belts. This allows for a full 360° of rotation without being limited by the rotational drive transfer mechanism used. At the same time, the present inventor determined that rather than using rotational encoders located at the drive motor outputs, as is typically done in such robots, it would be preferable to mount rotational encoders at each rotational joint in the robot arm—even when there is no motor located at that rotational joint. In a traditional wafer handling robot arm system, the rotational encoders are collocated with the motors (or even built into the motors as an integrated unit, e.g., a servomotor) since this allows the wiring for the rotational encoders and the motors to be commonly routed. It also avoids the need, for many robot arm joints, to pass wiring for the encoders through the rotational joints (or at least, avoids the need to pass wiring for the encoders through any rotational joints that do not already have electrical feed-throughs or cabling for controlling any motors that could potentially be located in, for example, the robot arm link segment adjacent to the base), thereby simplifying the robot arm design. In contrast, the new wafer handling robot arms that are the subject of this disclosure may route wiring to the rotational encoders through the various kinematic joints of the robot arm that are interposed between the base of the arm and the locations where the rotational encoders are located. Thus, the rotational joints may be hollow along their centerlines in order to allow such cabling to pass through them without being exposed to the environment outside of the arms and to reduce the amount of movement that such cables experience during movement of the robot arms. In some alternative such designs, the cables themselves may not be continuous or may not even be cables. For example, flexible or inflexible printed circuit substrates may be used to provide conductive paths for the signals to and from the rotational encoders, and slip rings or other similar mechanisms for providing electrical continuity across a rotating interface may be used to electrically connect the rotational encoders to a controller. Such slip rings or similar mechanisms may be located within, for example, the sealed portions of the rotational joints in order to protect the electrically conductive paths and also prevent any particulates that are generated by such mechanisms from escaping the robot arm (other than through the base).

For the purposes of this disclosure, the phrases "directly driven," "direct drive," "directly drive," and variants thereof refer to a relationship between a rotating part and the motor that provides rotational input to the rotating part in which the motor has a center of rotation that is generally coaxial with the axis of rotation of the rotating part (there may be some minor misalignment due to manufacturing tolerances, and some systems may use a rotational flex coupler to accommodate such misalignment, but the motor rotational axis and the rotating part rotational axis will still be understood to be "generally coaxial with one another"). Rotating parts that are directly driven by their respective motors are also rotated at the same speed as the rotational output of those motors; there is no intermediate gear reduction or other speed reduction/enhancer interposed between the motor and the rotating part.

Similarly, the phrases "indirectly driven," "indirect drive," "indirectly drive," and variants thereof refer to a relationship between a rotating part and the motor that provides rotational input to the rotating part in which the motor has a center of rotation that is offset (by some designed-in amount, as opposed to offsets that occur due to assembly or manufacturing tolerances) from the axis of rotation of the rotating part in a direction perpendicular to that axis of rotation. In the context of this application, mechanisms that enable such indirect drives are referred to as "rotational drive transfer mechanisms." Such rotational drive transfer mechanisms generally include two pulleys, each of which is attached to either the driving rotating part (which may be the output of a motor or may be driven by some other rotational input, e.g., the rotational output of another rotational drive transfer mechanism) or the driven rotating part. In practice, each rotating part may have a single pulley or may have multiple pulleys that are connected with the same shaft or other common portion of the rotating part. In such multiple-pulley scenarios, the term pulley may be understood to apply to a pulley individually or to the pulleys, in aggregate, that rotate in unison about the same axis.

Thus, the wafer handling robots described below, which are simply examples of robot arms embodying the concepts set forth herein and are not intended to limit the application of these concepts to other robot arms, may be generally described as having at least one rotational drive transfer mechanism and at least one rotational joint in between movable links of the robot arms that is driven by such a rotational drive transfer mechanism and that has a rotational encoder that is associated with that rotational joint. Such robot arms may also include additional rotational drive mechanisms and rotational joints, as well as additional rotational encoders at those additional rotational joints.

The wafer handling robots described below, and other robots embodying similar concepts, may also be able to achieve positioning accuracy that is currently unheard of in the robot arm industry. For example, for a typical robot arm having a maximum extended length (measured from the center of rotation of the arm to the center of the wafer being transported by the arm) of approximately 1.7 meters, the concepts discussed herein, including placement of rotational encoders at each rotational joint, may allow for such a robot arm to have a wafer-positioning accuracy or repeatability of as low as ±25 µm, which is nearly two-thirds less than many state-of-the-art wafer handling robots (which may have wafer-positioning accuracy or repeatability of ±70 µm). The improved wafer-positioning accuracy may allow wafers to be placed or centered on receiving wafer pedestals or chucks in the semiconductor processing chambers with higher accuracy, allowing for smaller feature sizes to be processed on the wafer.

A further benefit to the wafer handling robots discussed below is that the placement of the encoders at the rotational joints, as opposed to at the rotational inputs (motors) allows for any increased imprecision that may result from using timing belts or other non-steel belts to be accounted for and removed through a closed-loop control system. For example, if a timing belt stretches somewhat while being used, such stretching will result in the driven pulley being in a slightly different rotational orientation than the driving pulley (assuming a 1:1 pulley diameter ratio), which would lead to increased inaccuracy regarding where the movable links are in the robot arm if the driving pulley is where the rotational encoder is located.

Figure 6:
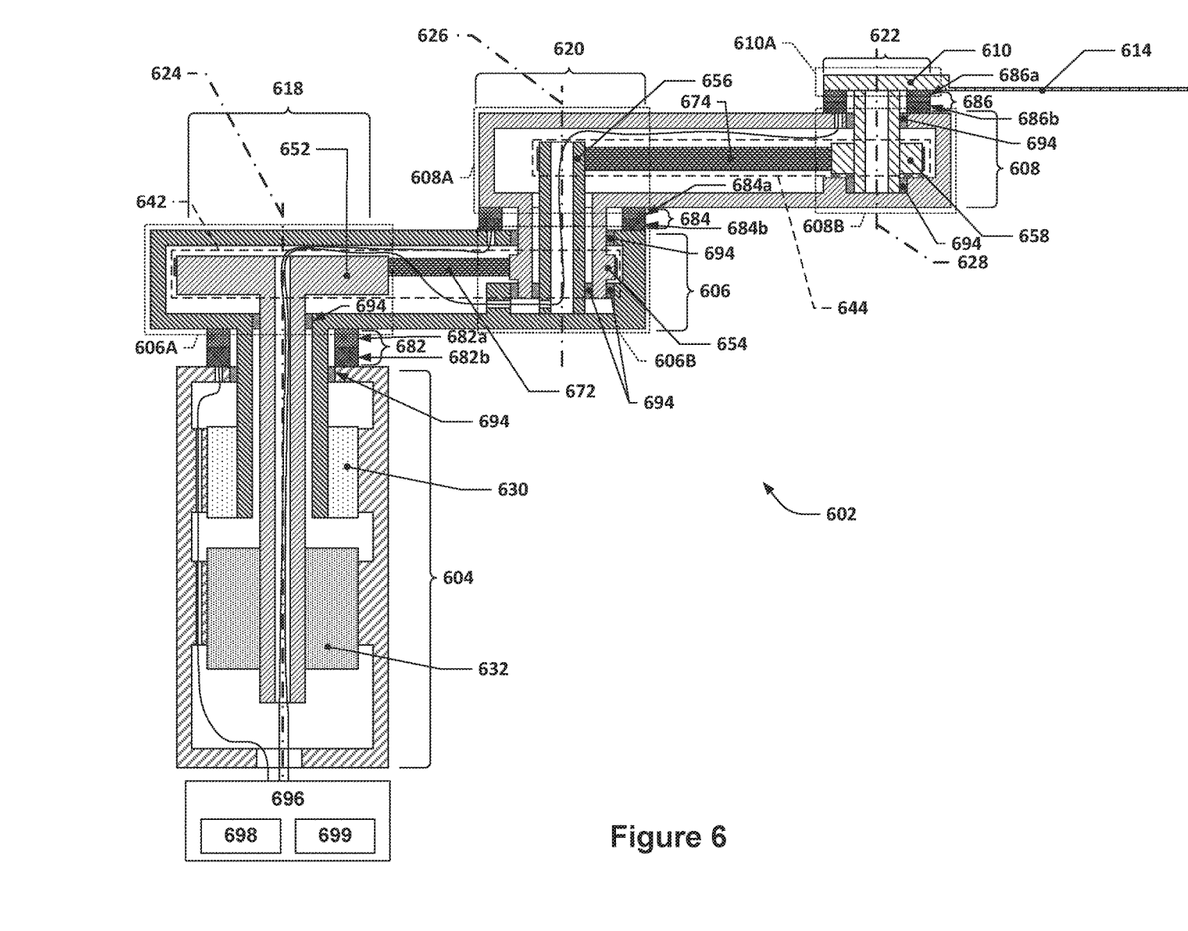
FIG. 6 depicts an example wafer handling robot.

FIG. 6 depicts a diagram of an example wafer handling robot arm. In FIG. 6, an example robot arm 602 is depicted. The robot arm 602, in this example, has a base 604, a first movable link 606, a second movable link 608, and a third movable link 610. The third movable link 610 terminates in a first end effector 614, which may be a blade-type end effector that may be placed underneath a semiconductor wafer, like a spatula, in order to lift it from below. A first end 606A of the first movable link 606 may be rotatably connected with the base 604 via a first rotational joint 618, which may include one or more sets of rotational bearings 694. Similarly, a first end 608A of the second movable link 608 may be rotatably connected with a second end 606B of the first movable link 606 by a second rotational joint 620 and a first end 610A of the third movable link 610 may be rotatably connected with a second end 608B of the second movable link 608 by a third rotational joint 622. The first rotational joint 618 may be configured to allow the first movable link 606 to rotate about a first rotational axis 624 relative to the base 604 responsive to a rotational input received from a first motor 630 located in the base 604. Similarly, the second rotational joint 620 may be configured to allow the second movable link 608 to rotate about a second rotational axis 626 relative to the first movable link 606, and the third rotational joint 622 may be configured to allow the third movable link 610 to rotate about a third rotational axis 628 relative to the second movable link 608. The rotational joints discussed herein may also be referred to as rotational interfaces herein.

The depicted example robot arm 602 has only two degrees of freedom—extension and retraction of the first end effector 614 along an axis intersecting with, and perpendicular to, the first rotational axis 624. Accordingly, there are only two motors shown, the first motor 630 and a second motor 632. Both motors are housed within the base to avoid having the weight of the motors be located in the movable links.

In this example robot arm, the first motor 630 directly drives the first movable link 606, as is shown by the tubular shaft that extends down into the first motor 630. The second motor 632, however, indirectly drives the second movable link 608 through a first rotational drive transfer mechanism 642, which includes a first pulley 652, a second pulley 654, and a first belt 672. The first belt 672 is, in this example, a timing belt or other continuous-loop belt. The first pulley 652 is directly driven by the second motor 632, and the second pulley 654 is fixedly connected with the second movable link 608 such that the second movable link 608 and the second pulley 654 move in unison. When the first pulley 652 is rotated about the first rotational axis 624 relative to the first movable link 606, e.g., by actuating the second motor 632 without actuating the first motor 630 (or by actuating both motors at different speeds and/or directions), the relative rotational motion may be transferred to the second pulley 656 by way of the first belt 672, thereby causing the second pulley 656, and the second movable link 608 connected therewith, to rotate relative to the first movable link 606.

In addition to the first rotational drive transfer mechanism 642 located in the first movable link 606, the robot arm 602 may also have a second rotational drive transfer mechanism 644 that is located in the second movable link 608. The second rotational drive transfer mechanism 644 may include a third pulley 656 (which, in this case, is simply the outside of a tubular shaft that extends through the second rotational joint 620), a fourth pulley 658, and a second belt 674. In this particular implementation, the third pulley 656 is fixedly connected with the first movable link 606. As a result, relative rotational movement about the second rotational axis 626 between the first movable link 606 and the second movable link 608 (as may be caused by operation of the first rotational drive transfer mechanism 642) may, in turn, cause the second rotational drive transfer mechanism 644 to operate. Such relative rotational movement may thus be transferred to the third movable link 610 via the fourth pulley 658, which may be connected with the third movable link 610 and therefore directly drive the third movable link 610.

In this example, the first pulley 652 and the second pulley 654 have a 2:1 diameter ratio, which will cause the second pulley 654 to rotate twice as fast and far as the first pulley 654; such a ratio may be used to cause the first movable link 606 and the second movable link 608 to "scissor" outwards and inwards while the third rotational axis 628 translates along a radius extending away from the first rotational axis 624. Correspondingly, the third pulley 656 and the fourth pulley 658 have a 1:2 diameter ratio, which causes the third movable link 610 and the first end effector 614 to rotate about the third rotational axis 628 at half the speed at which the first movable link 606 and the second movable link 608 rotate about the second rotational axis 626 relative to one another. This causes the first end effector 614 to remain aligned with the previously mentioned radius during extension and retraction of the robot arm 602.

As mentioned above, the robot arm 602 also includes rotational encoders located at each rotational joint. For example, a first rotational encoder 682 may be located at the first rotational joint 618, a second rotational encoder 684 may be located at the second rotational joint 620, and a third rotational encoder may be located at the third rotational joint 622. A rotational encoder, as the term is used herein, refers to a sensor device that is configured to measure rotational displacement about an axis between two components. Such devices include two portions, each of which is affixed to a different one of the two components. The two portions are free to rotate relative to one another, of course, and may, in some instances, be coupled together into a single, integrated unit (much like a ball bearing may have inner and outer races, each of which interfaces with a different one of the two parts between which the ball bearing is installed). In other instances, the two portions may be physically disconnected from one another, e.g., one portion may be installed on one rotatable component with the other portion installed on the other rotatable component—then the two rotatable components are mated together, the two portions of the rotational encoder may align with one another to permit rotational position measurement, but the two portions may actually never come into contact with one another during operation. In FIG. 6, the first rotational encoder 682 may have a first portion 682*a* that is fixedly connected with the first movable link 606 and a second portion 682*b* that is fixedly connected with the base 604. Similarly, the second rotational encoder 684 may have a first portion 684*a* that is fixedly connected with the second movable link 608 and a second portion 684*b* that is fixedly connected with the first movable link 606, and the third rotational encoder 686 may have a first portion 686*a* that is fixedly connected with the third movable link 610 and a second portion 686*b* that is fixedly connected with the second movable link 608.

Encoders suitable for use in the wafer handling robot arms discussed herein may generally be of the optically based variety, e.g., encoders in which one portion includes a set of high-precision fiducial marks that are optically readable by a sensor located in the second portion. Other types of encoders, e.g., mechanical, magnetic, or capacitive encoders, are generally unsuitable for use in such robot arms due to poor accuracy, friction, or other factors. Examples of rotational encoders that may be used in the implementations discussed herein include, for example, the RESOLUTE™ encoder series offered by Renishaw Plc. of New Mills, Wotton-under-Edge, Gloucestershire, UK. Such rotational encoders are capable of 32-bit resolution and can provide rotational angle measurement accuracies of up to ±1 arc second) (±0.0002778°. Optical rotational encoders are generally more expensive than other types of rotational encoders and more prone to experiencing performance degradation when dirty, e.g., when dust accumulates on the optical sensors or light emitters of such rotational encoders. Nonetheless, the present inventor determined that the precision provided by such optical rotational encoders outweighed such potential disadvantages.

The rotational encoders in the robot arm 602 may be connected with a controller 696, which may include one or more processors 699 and a memory 698 by way of one or more cables that are fed through the various rotational joints of the robot arm that separate each rotational encoder from the base 604. The memory 698 may, for example, store instructions for executing a PID (proportional-integral-derivative) control loop that utilizes data from the rotational encoders in order to determine rotational speeds for the motors (the controller 696 may also be communicatively connected with the motors and to provide control signals for controlling the motors to the motors).

The robot arm 602 that is shown in FIG. 6 is suitable for use in atmospheric conditions and does not, as shown, include seals or other features that would render it suitable for use in a vacuum environment. However, it is to be understood that such a robot arm could easily be modified to operate in a vacuum by replacing or augmenting some or all of the existing rotational bearings with vacuum-rated/sealed bearings, as will be discussed in more detail with reference to the following implementation. Furthermore, while the rotational encoders are shown mounted externally to the robot arm, other implementations may feature such rotational encoders at located within the movable links and/or the base 604 so as to better protect the rotational encoders from damage and dirt.

Figure 7:
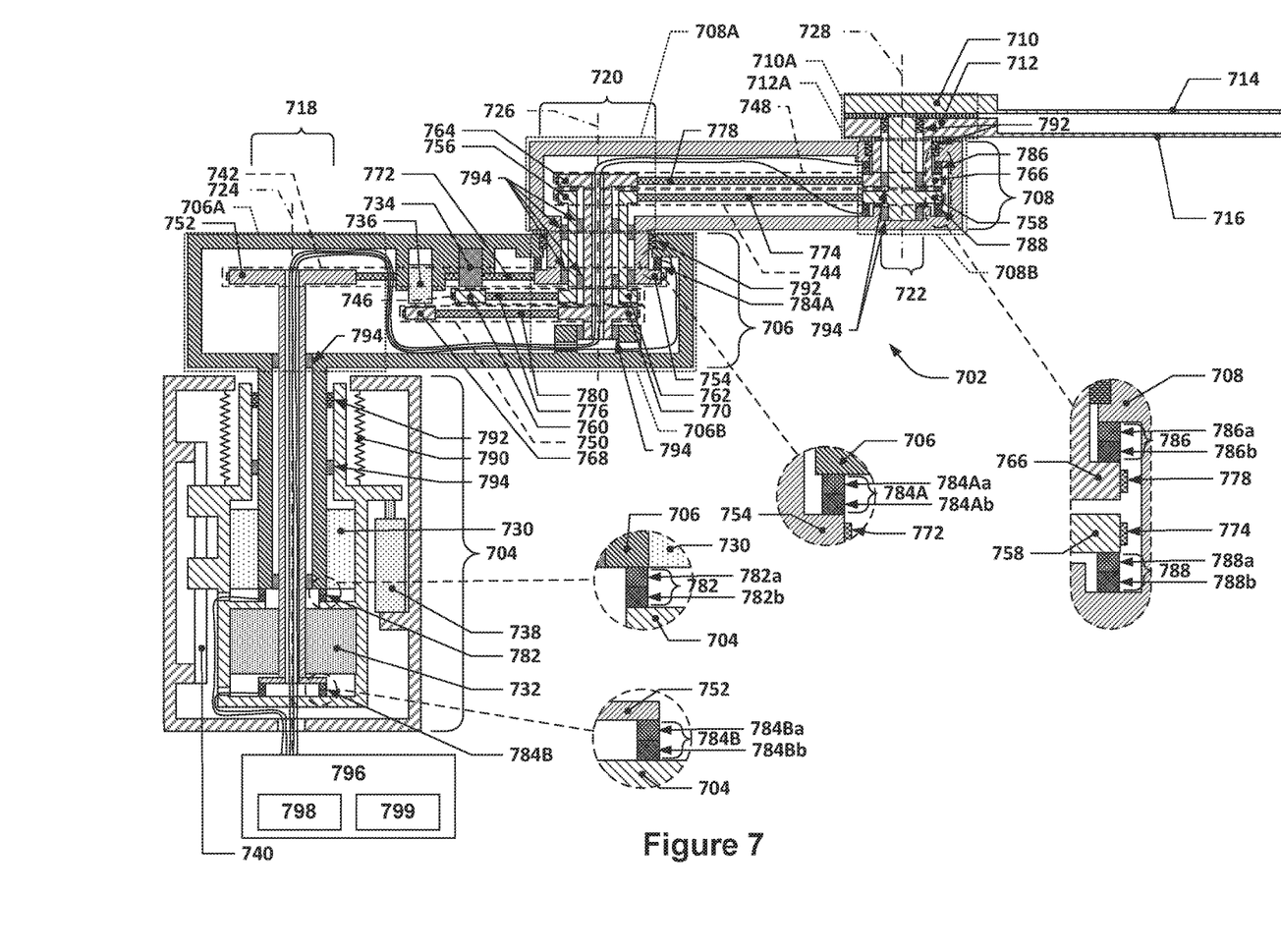
FIG. 7 depicts another example of a wafer handling robot.

FIG. 7 depicts another example robot arm that is more complex than that shown in FIG. 6; the depicted example not only includes two end effectors, but each end effector is also capable of independent rotation relative to the movable link that supports them. The depicted example also includes z-axis motion capability (which, it will be understood, may also be implemented in implementations similar to that shown in FIG. 6) and is configured to operate in a vacuum environment.

In FIG. 7, an example robot arm 702 is depicted. The robot arm 702, in this example, has a base 704, a first movable link 706, a second movable link 708, a third movable link 710, and a fourth movable link 712. The third movable link 710 and the fourth movable link 712 terminate in a first end effector 714 and a second end effector 716, respectively, which may be blade-type end effectors that may be placed underneath semiconductor wafers, like a spatula, in order to lift them from below. A first end 706A of the first movable link 706 may be rotatably connected with the base 704 via a first rotational joint 718, which may include one or more sets of rotational bearings 794. Similarly, a first end 708A of the second movable link 708 may be rotatably connected with a second end 706B of the first movable link 706 by a second rotational joint 720 and a first end 710A of the third movable link 710 may be rotatably connected with a second end 708B of the second movable link 708 by a third rotational joint 722. The first rotational joint 718 may be configured to allow the first movable link 706 to rotate about a first rotational axis 724 relative to the base 704 responsive to a rotational input received from a first motor 730 located in the base 704. Similarly, the second rotational joint 720 may be configured to allow the second movable link 708 to rotate about a second rotational axis 726 relative to the first movable link 706, and the third rotational joint 722 may be configured to allow the third movable link 710 and the fourth movable link 712 to independently rotate about a third rotational axis 728 relative to the second movable link 708.

Unlike the robot arm 602, the depicted example robot arm 702 has five degrees of freedom. In order to provide such degrees of freedom, the robot arm 702 includes a total of four motors and a linear actuator 738. The first motor 730 and a second motor 732, as well as the linear actuator 738, are housed within the base, whereas a third motor 734 and a fourth motor 736 are located in the first movable link 706. It is to be understood that the third motor 734 and/or the fourth motor 736 could, alternatively, be housed in the base 704 as well, and their rotational output communicated through the first rotational joint 718 using concentric drive shafts (like is already done for the output of the second motor 732). The linear actuator 738 may be used to drive a sub-portion of the base that houses the first motor 730 and the second motor 732, as well as supports the first rotational joint 718 and the movable links, up and down in the vertical dimension to facilitate z-axis movement. A guide rail 740 may guide such motion and provide for stable movement along the z-axis. A bellows 790 may be provided to seal the movable sub-portion of the base 704 to the remainder of the base 704, thereby allowing for vertical movement of the sub-portion relative to the remainder of the base 704 without providing a leak path for gas into the base 704. In practice, the upper surface of the base 704 may, for example, be connected to an interface to a transfer module in an air-tight fashion to prevent leakage past the upper surface of the base 704, thereby allowing a vacuum environment around the movable links of the robot arm 702 to be maintained.

In this example robot arm, the first motor 730 directly drives the first movable link 706, as is shown by the tubular shaft that extends down into the first motor 730. The second motor 732, however, indirectly drives the second movable link 708 through a first rotational drive transfer mechanism 742, which includes a first pulley 752, a second pulley 754, and a first belt 772. The first belt 772 is, in this example, a timing belt or other continuous-loop belt. The first pulley 752 is directly driven by the second motor 732. Unlike the second pulley 654, however, the second pulley 754 is fixedly connected with the second movable link 708 such that the second movable link 708 and the second pulley 754 move in unison. When the first pulley 752 is rotated about the first rotational axis 724 relative to the first movable link 706, e.g., by actuating the second motor 732 without actuating the first motor 730 (or by actuating both motors at different speeds and/or directions), the relative rotational motion between them may be transferred to the second pulley 756 by way of the first belt 772, thereby causing the second pulley 756, and the second movable link 708 connected therewith, to rotate relative to the first movable link 706.

In addition to the first rotational drive transfer mechanism 742 located in the first movable link 706, the robot arm 702 may also have a second rotational drive transfer mechanism 744 that is located in the second movable link 708. The second rotational drive transfer mechanism 744 may include a third pulley 756, a fourth pulley 758, and a second belt 774. In contrast to the third pulley 656, which was fixedly connected with the first movable link 606, the third pulley 756 is, in this example, rotatably connected with the first movable link 706 so that the first movable link 706 and the third pulley 756 may be rotated independently about the second rotational axis 726. In this example, the third pulley 756 is driven by a third rotational drive transfer mechanism 746, which may include a fifth pulley 760, a sixth pulley 762, and a third belt 776. The output of the third motor 734 may drive the fifth pulley 760, which, in turn, drives the third belt 776, thereby causing the sixth pulley 762, as well as the third pulley 756 that is fixedly connected therewith, to rotate—this causes the fourth pulley 758, and the third movable link 710 fixedly connected therewith, to rotate relative to the second movable link 706. It is to be understood that other implementations may have a third motor 734 that directly drives the sixth pulley 762/third pulley 756 or may locate the third motor 734 in the base, with additional drive transfer mechanisms used to convey the motive power from the third motor 734 to the sixth pulley 762 (and thus the third pulley 756). It is to be understood that the third pulley 756 and the sixth pulley 762 may, in some instances, be the same diameter and even simply be different portions of the same cylindrical exterior surface of a tube (the same can be said for the seventh pulley 764 and the tenth pulley 770, which are discussed below). Since each rotational joint in this example robot arm is independently driven by a separate motor, the sizes of the various pulleys used may be varied, if desired, and any variations accommodated through control of the motor speeds/displacements.

In a dual end effector implementation, a fourth rotational drive transfer mechanism 748 may be provided that includes a seventh pulley 764, an eighth pulley 766, and a fourth belt 778. The eighth pulley 766 may be fixedly connected with the fourth movable link 712 such that rotation of the eighth pulley 766 about the third rotational axis 728 relative to the second movable link 708 causes the fourth movable link 712 and the second end effector 716 to also rotate about the third rotational axis 728 relative to the second movable link 708. Similar to the third pulley 756, the seventh pulley 764 may be rotatably connected with the first movable link 706 and the second movable link 708 such that the seventh pulley 764 may be rotated independently of the first movable link 706 and the second movable link 708. Thus, when the seventh pulley 764 is rotated about the second rotational axis 726 relative to the second movable link 708, the corresponding movement of the fourth belt 778 may cause the eighth pulley 766 to rotate as well, thereby causing rotation of the fourth movable link 712 about the third rotational axis 728 relative to the second movable link 708.

In this example, the seventh pulley 764 is driven by a fifth rotational drive transfer mechanism 750 which may include a ninth pulley 768, a tenth pulley 770, and a fifth belt 780. The output of the fourth motor 736 may drive the ninth pulley 768, which, in turn, drives the fifth belt 780, thereby causing the tenth pulley 770, as well as the seventh pulley 764 that is fixedly connected therewith, to rotate—this causes the eighth pulley 766, and the fourth movable link 712 fixedly connected therewith, to rotate relative to the second movable link 706. It is to be understood that other implementations may have a fourth motor 736 that directly drives the seventh pulley 764/tenth pulley 770 or may locate the fourth motor 736 in the base 704, with additional drive transfer mechanisms used to convey the motive power from the fourth motor 736 to the tenth pulley 770 (and thus the seventh pulley 764).

Such configurations allow the second motor 732 and the third motor 734 to independently control the relative rotational positions of the second movable link 708 and the third movable link 710, respectively.

As mentioned above, the robot arm 702 also includes rotational encoders located at each rotational joint. For example, a first rotational encoder 782 may be located near the first rotational joint 718 (in this case, it is located adjacent to the first motor 730 and is located within the base 704, but it is still centered on the first rotational axis 724 of the first rotational joint 718), a second rotational encoder 784A may be located at the second rotational joint 720, a third rotational encoder 786 and a fourth rotational encoder 788 may be located at the third rotational joint 722.

In FIG. 7, the first rotational encoder 782 may have a first portion 782a that is fixedly connected with the first movable link 706 and a second portion 782b that is fixedly connected with the base 704. Similarly, the second rotational encoder 784A may have a first portion 784Aa that is fixedly connected with the second movable link 708 and a second portion 784Ab that is fixedly connected with the first movable link 706, the third rotational encoder 786 may have a first portion 786a that is fixedly connected with the third movable link 710 and a second portion 786b that is fixedly connected with the second movable link 708, and the fourth rotational encoder 788 may have a first portion 788a that is fixedly connected with the fourth movable link 712 and a second portion 788b that is fixedly connected with the second movable link 708. Additionally, in some implementations, additional rotary encoders (also referred to as rotational encoders herein) may be provided at other locations to provide for the possibility of even greater accuracy. For example, an additional second rotational encoder 784B may be provided at the second motor 632 (with a first portion 784Ba fixedly connected with the first pulley 752 and a second portion 784Bb fixedly connected with the base 704); in such instances, the output of the second rotational encoder 784A, which is positioned at the second rotational joint 720, may be used to provide positional data to the control loop, whereas the other second rotational encoder 784B, which is positioned at the second motor 732, may be used to provide velocity data to the control loop. This approach may be used to account for any compliance in the first belt 772; similar approaches may be adopted for the other rotational encoders used as well, if desired.

As with the robot arm 602, the robot arm 702 also may include a controller 796 with a memory 798 and one or more processors 799; the memory 798 may similarly store computer-executable instructions for controlling the robot arm 702, e.g., instructions for executing a PID routine to use inputs from the rotational encoders in order to control the motors to cause the robot arm to move to a desired position.

Another difference between the robot arm 602 and the robot arm 702 is that the robot arm 702 includes vacuum-tight rotary seals 792 at each rotational joint, or at least at each rotational joint that has a pulley with a belt attached to it. Examples of such vacuum-tight seals are ferrofluidic seals, which provide a robust, low-friction vacuum-tight seal that does not produce much, if any, particulate contamination (any metal particles that are abraded off during operation are immediately captured by the magnetic field of the seal, thereby preventing the migration of such particles onto, for example, a wafer being transported by the wafer handling robot). The vacuum tight seals may be integrated into bearing assemblies or used in combination with rotational bearings that allow for smooth rotational motion through the vacuum-tight seal. This allows the interior of the movable links that are sealed with vacuum-tight seals to be kept at atmospheric pressure, while the environment around the movable links is kept at vacuum. Generally speaking, only the outermost seals for each movable link that is held at atmospheric pressure may be provided by vacuum-tight seals; the other rotational bearings may not be equipped with such seals. By sealing the belt-drive systems in atmospheric sections of the movable links, any particulates generated by the belts will be kept isolated from the vacuum environment, thereby preserving its cleanliness.

It is to be understood that the concepts of off-center robot arm mounting, the use of timing belts in place of steel belts, and the use of rotary encoders at each rotational joint of the robot arm may each represent a separate idea and may be implemented separately or as an interdependent combination or subcombination. Thus, for example, a robot arm with timing belts and joint-mounted rotary encoders may be used in non-off-center mounting locations, and so forth.

It is to be understood that the term "set," unless further qualified, refers to a set of one or more items—it does not require that multiple items be present unless there is further language that implies that it does. For example, a "set of two or more items" would be understood to have, at a minimum, two items in it. In contrast, a "set of one or more items" would be understood to potentially only have one item in it. In a similar vein, it is to be understood that the term "each" may be used herein to refer to each member of a set, even if the set only includes one member. The term "each" may also be used in the same manner with implied sets, e.g., situations in which the term set is not used but other language implies that there is a set. For example, "each item of the one or more items" is to be understood to be equivalent to "each item in the set of one or more items."

As discussed above, in some implementations, a controller may be part of the wafer handling systems discussed herein. The wafer handling system may also be viewed as being a semiconductor processing tool, e.g., it may also include semiconductor processing equipment, including a processing chamber or chambers, a platform or platforms for processing, and/or specific processing components (a wafer pedestal, a gas flow system, etc.). These systems (including the robot arm) may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, such as processes for controlling the wafer handling robot, as well as other processes or parameters not discussed herein, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a chamber and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example wafer handling systems may include or have attached to them a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It is to be understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. A wafer handling system comprising:
   a robot arm including:
   a base;
   a first movable link, a first end of the first movable link rotatably connected to the base via a first rotational joint;
   a second movable link, a first end of the second movable link rotatably connected to a second end of the first movable link via a second rotational joint;
   a first rotational drive transfer mechanism including a first pulley, a second pulley, and one or more first belts spanning between the first pulley and the second pulley, wherein:
   the second pulley is fixedly connected with the second movable link, and
   the first rotational drive transfer mechanism is configured such that rotation of the first pulley relative to the first movable link causes the second pulley and the second movable link to rotate relative to the first movable link about a center axis of the second rotational joint;
   a first motor, the first motor located in the base and having a rotational output connected to the first movable link and configured to drive the first movable link;
   a second motor, the second motor located in the base and having a rotational output connected to the first pulley and configured to drive the first pulley;
   a first rotational encoder with a first portion fixedly connected with the base and a second portion fixedly connected with the first movable link; and
   a second rotational encoder with a first portion fixedly connected with the first movable link and a second portion fixedly connected with the second movable link.

2. The wafer handling system of claim 1, wherein the first rotational encoder and the second rotational encoder each have a resolution selected from the group consisting of: 30 bits or more and 33 micro-degrees or more.

3. The wafer handling system of claim 1, wherein:
   the first rotational joint includes a first ferrofluidic seal between the base and a portion of the first movable link that extends into the base, and
   the second rotational joint includes a second ferrofluidic seal between the first movable link and a portion of the second movable link that extends into the first movable link.

4. The wafer handling system of claim 1, wherein the robot arm further includes:
   a third movable link, a first end of the third movable link rotatably connected to a second end of the second movable link via a third rotational joint;
   a second rotational drive transfer mechanism including a third pulley, a fourth pulley, and one or more second belts spanning between the third pulley and the fourth pulley; and
   a third rotational encoder with a first portion fixedly connected with the second movable link and a second portion fixedly connected with the third movable link, wherein:
   the third pulley is fixedly connected with the first movable link,
   the fourth pulley is fixedly connected with the third movable link, and
   the second rotational drive transfer mechanism is configured such that rotation of the third pulley relative to the second movable link causes the fourth pulley and the third movable link to rotate relative to the second movable link about a center axis of the third rotational joint.

5. The wafer handling system of claim 1, wherein the robot arm further includes:
   a third motor;
   a third movable link, a first end of the third movable link rotatably connected to a second end of the second movable link via a third rotational joint;
   a second rotational drive transfer mechanism including a third pulley, a fourth pulley, and one or more second belts spanning between the third pulley and the fourth pulley; and
   a third rotational encoder with a first portion fixedly connected with the second movable link and a second portion fixedly connected with the third movable link, wherein:
   the third motor is configured to cause the third pulley to rotate about a rotational axis of the second rotational joint,
   the fourth pulley is fixedly connected with the third movable link, and
   the second rotational drive transfer mechanism is configured such that rotation of the third pulley about the center axis of the second rotational joint relative to second movable link causes the fourth pulley and the third movable link to rotate relative to the second movable link about a center axis of the third rotational joint.

6. The wafer handling system of claim 5, wherein:
   the first rotational joint includes a first ferrofluidic seal between the base and a portion of the first movable link that extends into the base,
   the second rotational joint includes a second ferrofluidic seal between the first movable link and a portion of the second movable link that extends into the first movable link, and the third rotational joint includes a third ferrofluidic seal between the second movable link and a portion of the third movable link that extends into the second movable link.

7. The wafer handling system of claim 5, wherein the first movable link includes a third rotational drive transfer mechanism that includes a fifth pulley, a sixth pulley, and one or more third belts spanning between the fifth pulley and the sixth pulley.

8. The wafer handling system of claim 7, wherein the third motor is located within the first movable link.

9. The wafer handling system of claim 7, wherein the robot arm further includes:
a fourth motor;
a fourth movable link, a first end of the fourth movable link rotatably connected to a second end of the second movable link via the third rotational joint;
a fourth rotational drive transfer mechanism including a seventh pulley, an eighth pulley, and one or more fourth belts spanning between the seventh pulley and the eighth pulley; and
a fourth rotational encoder with a first portion fixedly connected with the second movable link and a second portion fixedly connected with the fourth movable link, wherein:
the fourth motor is configured to cause the seventh pulley to rotate about a rotational axis of the second rotational joint,
the eighth pulley is fixedly connected with the fourth movable link, and
the fourth rotational drive transfer mechanism is configured such that rotation of the seventh pulley about the center axis of the second rotational joint relative to the second movable link causes the eighth pulley and the fourth movable link to rotate relative to the second movable link about a center axis of the third rotational joint.

10. The wafer handling system of claim 9, wherein the first movable link further includes a fifth rotational drive transfer mechanism that includes a ninth pulley, a tenth pulley, and one or more fifth belts spanning between the ninth pulley and the tenth pulley.

11. The wafer handling system of claim 10, wherein the fourth motor is located within the first movable link.

12. The wafer handling system of claim 1, wherein:
the one or more first belts are made of stainless steel,
the one or more first belts includes at least two first belts, and
each belt of the at least two first belts has a first end fixedly attached to one of the first pulley of the first rotational drive transfer mechanism and the second pulley of the first rotational drive transfer mechanism and a second end fixedly attached to the other of the first pulley of the first rotational drive transfer mechanism and the second pulley of the first rotational drive transfer mechanism.

13. The wafer handling system of claim 1, wherein:
interior spaces of the base, the first movable link, and the second movable link are in fluidic communication with one another; and
the first rotational joint and the second rotational joint are both equipped with vacuum-rated seals.

14. The wafer handling system of claim 13, wherein each of the one or more first belts is a continuous belt.

15. The wafer handling system of claim 14, wherein:
each of the one or more first belts is selected from the group consisting of: a v-belt, a flat belt, a toothed belt, and a round belt; and
each of the one or more first belts is made from a material or materials selected from the group consisting of: rubber and rubber in combination with a woven material.

16. The wafer handling system of claim 1, further comprising a chamber having a nominal width, length, and height, wherein:
the chamber has a plurality of wafer stations arranged along opposing walls, each wafer station having a wafer center point;
the width defines the nominal distance between the opposing walls;
the base is located with a center axis of the first rotational joint located within 10% to 30% of the width from one of the opposing walls.

17. The wafer handling system of claim 1, further comprising:
an end effector configured to support a semiconductor wafer and connected to the robot arm such that the end effector is supported by the first movable link and the second movable link, and
a controller having a memory and one or more processors, wherein:
the memory and the one or more processors are communicatively connected,
the memory stores computer-executable instructions for controlling the one or more processors to:
receive rotational position data from the first rotational encoder,
receive rotational position data from the second rotational encoder, and
determine a horizontal location of a point fixed in space relative to the end effector based, at least in part, on the rotational position data from the first and second rotational encoders.

18. The wafer handling system of claim 17, wherein the memory further stores computer-executable instructions for further controlling the one or more processors to control the first motor, the second motor, or the first motor and the second motor to activate for one or more periods of time to cause the point fixed in space relative to the end effector to move from a first location to a second location.

* * * * *

UNITED STATES PATENT AND TRADEMARK OFFICE
CERTIFICATE OF CORRECTION

PATENT NO. : 10,155,309 B1
APPLICATION NO. : 15/815325
DATED : December 18, 2018
INVENTOR(S) : Richard M. Blank It is certified that error appears in the above-identified patent and that said Letters Patent is hereby corrected as shown below:

In the Specification

In Column 5, Line 30, delete "the second belt 172B" and insert therein --the first belt 172A--;

In Column 5, Line 32, delete "quite" and insert therein --quiet--;

In Column 10, Line 8, delete "656" and insert therein --654--;

In Column 10, Line 9, delete "656" and insert therein --654--;

In Column 10, Line 34, delete "654" and insert therein --652--;

In Column 13, Line 12, delete "756" and insert therein --754--;

In Column 13, Line 13, delete "756" and insert therein --754--;

In Column 13, Line 36, delete "706" and insert therein --708--; and

In Column 14, Line 14, delete "706" and insert therein --708--.

Signed and Sealed this
Twelfth Day of January, 2021

Andrei Iancu
*Director of the United States Patent and Trademark Office*